United States Patent [19]

Flamm et al.

[11] 4,310,380
[45] Jan. 12, 1982

[54] PLASMA ETCHING OF SILICON

[75] Inventors: Daniel L. Flamm, Chatham Township, Morris County; Dan Maydan, Short Hills; David N. Wang, Warren Township, Somerset County, all of N.J.

[73] Assignee: Bell Telephone Laboratories, Incorporated, Murray Hill, N.J.

[21] Appl. No.: 138,083

[22] Filed: Apr. 7, 1980

[51] Int. Cl.³ .......................................... H01L 21/306
[52] U.S. Cl. .................... 156/643; 156/646; 156/657; 156/659.1; 156/662; 204/192 E; 252/79.1
[58] Field of Search ................... 204/192 E, 298, 164; 156/643, 646, 657, 659.1, 662, 345; 252/79.1

[56] References Cited

U.S. PATENT DOCUMENTS

| 3,669,774 | 6/1972 | Dismukes | 156/646 |
| 4,190,488 | 2/1980 | Winters | 156/646 X |
| 4,211,601 | 7/1980 | Mogab | 156/643 |

Primary Examiner—William A. Powell
Attorney, Agent, or Firm—Lucian C. Canepa

[57] ABSTRACT

By utilizing a fluorine-containing gaseous compound in a plasma etching process, isotropic etching of monocrystalline silicon (48) and doped or undoped polycrystalline silicon (54) is achieved. The etching processes, which are applicable, for example, to pattern delineation in the processing of semiconductor wafers, are substantially free of any proximity effects and are characterized by a high etching rate at relatively low power levels, high selectivity (with respect to, for example, silicon dioxide) and excellent uniformity. By mixing other gases (for example, chlorine) with the fluorine-containing gas, the amount of undercutting achieved during the etching process can be selectively controlled.

6 Claims, 7 Drawing Figures

1

PLASMA ETCHING OF SILICON

BACKGROUND OF THE INVENTION

This invention relates to the fabrication of microminiature devices such as integrated circuits and, more particularly, to the delineation of fine-line patterns in such devices by dry etching processes.

Considerable interest exists in employing dry processing techniques for patterning workpieces such as semiconductor wafers. The interest in such techniques stems from their generally better resolution and improved dimensional and shape control capabilities relative to standard wet etching. Thus, dry etching is being utilized increasingly for pattern delineation in the processing of, for example, semiconductor wafers to form large-scale-integrated (LSI) devices.

Various dry etching processes that involve the use of gaseous plasmas are known, as described, for example, in "Plasma-Assisted Etching for Pattern Transfer" by C. J. Mogab and W. R. Harshbarger, *Journal of Vacuum Science and Technology*, 16(2), March/April 1979, p. 408. As indicated therein, particular emphasis in recent work has been directed at developing processes that utilize reactive gas plasmas in a mode wherein chemical reactions are enhanced by charged particle bombardment.

Considerable effort has been directed recently at trying to devise reliable plasma etching processes for fine-line pattern delineation in silicon surfaces. Of particular practical interest has been the work directed at etching polysilicon. Polysilicon films, both doped and undoped, constitute constituent layers of commercially significant LSI devices such as 64K dynamic random-access-memories (RAMs) of the metal-oxide-semiconductor (MOS) type. Accordingly, it was recognized that improved methods of patterning silicon by plasma etching, if available, could contribute significantly to decreasing the cost and improving the performance of such devices and other structures that include silicon substrates or layers.

SUMMARY OF THE INVENTION

Hence, an object of the present invention is an improved dry etching process. More specifically, an object of this invention is an improved plasma etching process for silicon.

Briefly, these and other objects of the present invention are realized in a specific illustrative / embodiment thereof in which dry etching of monocrystalline silicon and doped or undoped polycrystalline silicon is achieved in a reaction chamber under specified conditions in a plasma formed from a fluorine-containing gaseous compound. If only a fluorine-containing gas is introduced into the chamber, the edge profile of the etched material is completely isotropic. By adding various other gases, for example chlorine, to the fluorine-containing gas, a mixed etching plasma is formed in which the extent of undercutting (maximum lateral etch) is a function of the volume percent of the additive included in the mixture.

In accordance with the present invention, a substantially uniform and relatively high etching rate for silicon is achieved at relatively low power levels. In applicants' process, the etching rate for silicon is significantly higher than various other materials (for example, silicon dioxide) included in LSI devices. Moreover, the edge profile achieved by the process is substantially independent of feature size and of the spacing between features.

More specifically, applicants' method is adapted for fabricating a microminiature device in accordance with a process sequence that includes at least one step in which a silicon surface of the device is to be etched with high selectivity relative to other surfaces of the device in a dry etching apparatus that comprises a plasma established between anode and cathode electrodes one of which electrodes holds the device to be etched. The plasma results from the imposition of an electric field across a gaseous environment between the electrodes. The gaseous environment comprises a fluorine-containing gaseous compound that provides in the apparatus under the influence of the electric field silicon-etching fluorine species and reaction products that do not etch the other surfaces of the device to any substantial extent relative to the etching of the silicon surface.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

In dry etching processes utilizing reactive plasmas as heretofore proposed, the workpieces to be etched are positioned on one of the electrodes included in the reaction chamber. In one such type of etching apparatus, the workpieces are placed on the grounded anode electrode. In another such apparatus, the workpieces are placed on the driven cathode electrode thereof. In accordance with the principles of the present invention, either type of apparatus can be used with a fluorine-containing gaseous compound to effect plasma etching of silicon.

In one particularly advantageous application of the inventive etching techniques described herein, workpieces previously processed in a plasma etching apparatus wherein the workpieces were mounted on the driven cathode electrode are to be further processed in accordance with the principles of the present invention. Accordingly, the main emphasis herein will be directed to applicants' etching techniques as practiced in an apparatus in which the workpieces are also placed on the driven cathode electrode. In that way, a continuous high-throughput fabrication sequence is realized.

Processes and equipment that utilize reactive gas plasmas in a mode wherein chemical reactions are enhanced by charged particle bombardment of workpieces mounted on the driven cathode electrode are known. One advantageous such process is described in *Proc. 6th Int'l Vacuum Congr.* 1974, *Japan. J. Appl. Phys.*, suppl. 2, pt. 1, pp. 435–438, 1974.

Figure 1:
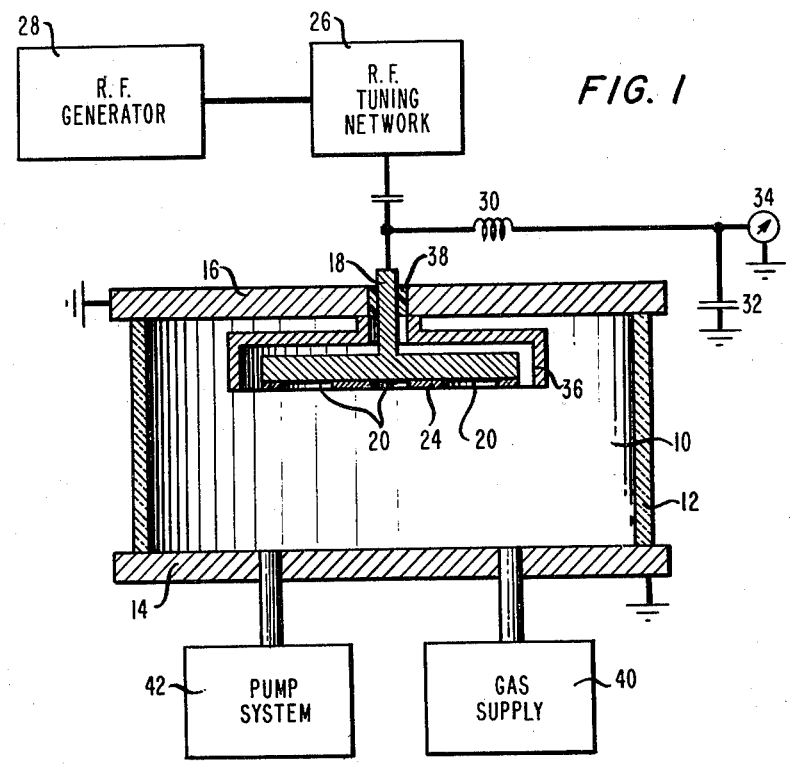
FIG. 1 is a schematic depiction of a specific illustrative parallel-plate reactor of the type in which the processes of the present invention can be carried out.
Figure 2:
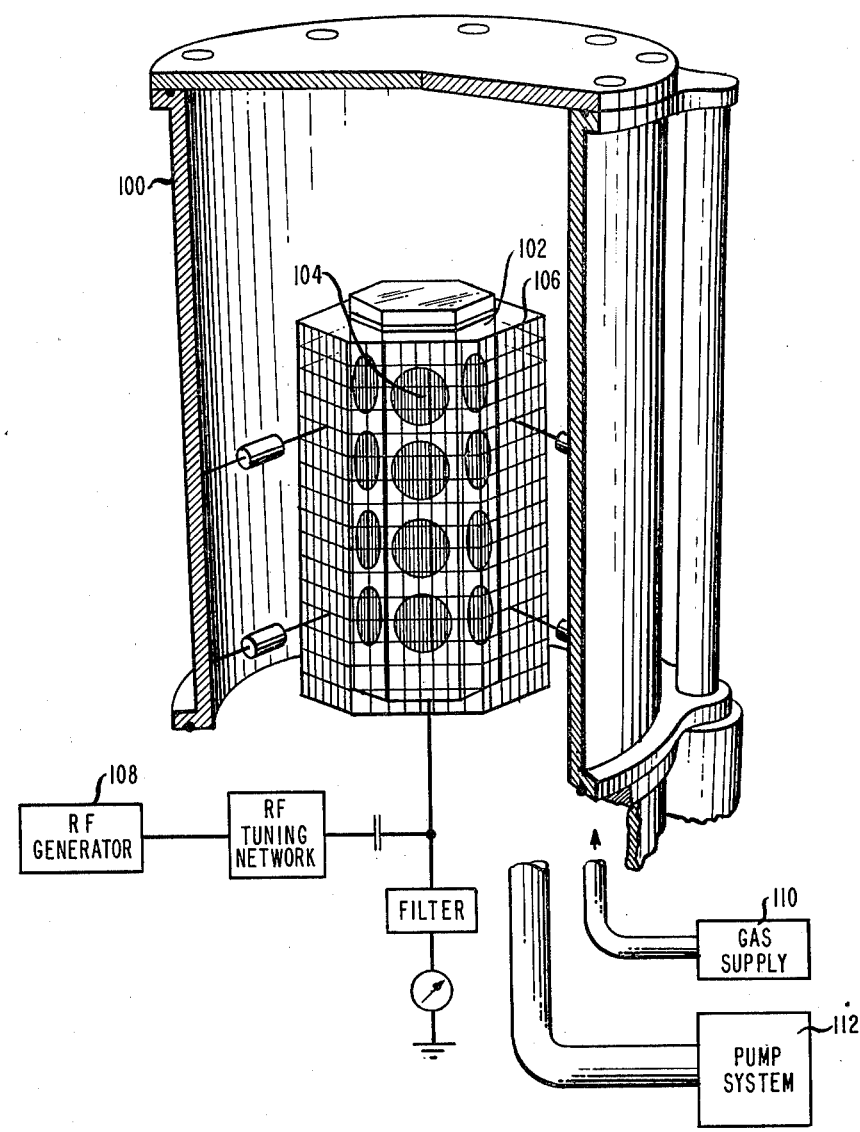
FIG. 2 is a schematic depiction of a specific illustrative multifaceted reactor to the type in which the processes of the present invention can be carried out.

In accordance with the principles of the present invention, reactive plasma etching is carried out in, for example, a parallel-plate reactor of the type depicted in FIG. 1 or in a so-called multifaceted reactor of the type shown in FIG. 2. The multifaceted reactor is described in more detail in a copending commonly assigned application of D. Maydan designated application Ser. No. 105,610, filed Dec. 20, 1979, now abandoned.

The particular illustrated parallel-plate reactor shown in FIG. 1 comprises an etching chamber 10 defined by a cylindrical nonconductive member 12 and two conductive end plates 14 and 16. Illustratively, the member 12 is made of glass and the plates 14 and 16 are each made of aluminum. in addition, the depicted reactor includes a conductive workpiece holder 18 also made, for example, of aluminum. In one illustrative case, the bottom of the holder 18 constitutes a 10-inch circular surface designed to have seven 3-inch wafers placed thereon.

Wafers 20, whose bottom (i.e, front) surfaces are to be etched, are indicated in FIG. 1 as being mounted on the bottom surface of the holder 18. The wafers 20 are maintained in place on the holder 18 by a cover plate 24 having apertures therethrough. The apertures are positioned in aligned registry with the wafers 20 and are each slightly smaller in diameter than the respectively aligned wafers. In that way, a major portion of the front surface of each wafer is exposed for etching. By any standard means (not shown), the cover plate 24 is secured to the holder 18.

Advantageously, the cover plate 24 included in the etching apparatus of FIG. 1 is made of a low-sputter-yield material that does not react chemically with the etching gas to form a nonvolatile material. Suitable such materials include anodized aluminum and fused silica.

The workpiece holder 18 shown in FIG. 1 is capacitively coupled via a radio-frequency tuning network 26 to a radio-frequency generator 28 which, by way of example, is designed to drive the holder 18 at a frequency of 13.56 megahertz. Further, the holder 18 is connected through a filter network, comprising an inductor 30 and a capacitor 32, to a meter 34 that indicates a direct-current voltage that approximates the peak value of the radio-frequency voltage applied to the holder 18.

In FIG. 1, the end plate 14 is connected to a point of reference potential such as ground. The plate 14 is the anode of the depicted reactor. The workpiece holder 18 constitutes the driven cathode of the reactor. In one specific illustrative reactor of the type shown in FIG. 1, the anode-to-cathode separation was approximately 10 inches and the diameter of the anode plate was approximately 17 inches.

The end plate 16 of the FIG. 1 arrangement is also connected to ground. Additionally, an open-ended cylindrical shield 36 surrounding the holder 18 is connected to the plate 16 and thus to ground. The portion of the holder 18 that extends through the plate 16 is electrically insulated therefrom by a nonconductive bushing 38.

In accordance with one feature of the principles of the present invention, a fluorine-containing gaseous atmosphere is established in the chamber 10 of FIG. 1. Gas is controlled to flow into the indicated chamber from a standard supply 40. Additionally, a prescribed low pressure condition is maintained in the chamber by means of a conventional pump system 42.

By introducing a suitable fluorine-containing gaseous compound into the chamber 10 (FIG. 1) and establishing an electrical field between the anode 14 and the cathode 18, as specified in particular detail below, a reactive plasma is generated in the chamber 10. The plasma established therein is characterized by a uniform dark space in the immediate vicinity of the workpiece surfaces to be etched. Volatile products formed at the workpiece surface during the etching process are exhausted from the chamber by the system 42.

It is advantageous to carry out applicants' herein-considered etching processes in a high-throughput multifaceted reactor of the type specified above. Such a reactor is described in detail in the aforecited Maydan application. A schematic representation of one particular embodiment thereof is depicted in FIG. 2 of this application.

The system depicted in FIG. 2 comprises a cylindrical etching chamber 100 made of an electrically conductive material such as, for example, aluminum or stainless steel. Centrally mounted within the chamber 100 is a workpiece holder 102. The particular illustrative holder 102 shown in FIG. 2 includes six flat surfaces or facets. By way of a specific example, each such surface is designed to have four 6-inch wafers mounted thereon. One such wafer is designated in FIG. 2 by reference numeral 104.

Interposed between the chamber 100 and the workpiece holder 102 of FIG. 2 is a supported grid element 106 whose structure and function are described in detail in the aforecited Maydan application. In addition, in the same manner specified above in connection with the description of FIG. 1, the workpiece holder of the FIG. 2 apparatus is capacitively coupled to and driven by a radio-frequency generator. The generator, designated 108 in FIG. 2, and associated conventional elements are shown in FIG. 2.

Also schematically shown in FIG. 2 are a gas supply 110 for introducing a specified gas or mixture of gases into the depicted reaction chamber and a standard pump system 112 for establishing a prescribed low-pressure condition in the chamber.

Figure 3:
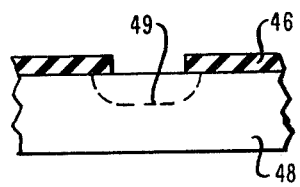
FIG. 3 is a cross-sectional representation of a masked monocrystalline silicon member that is capable of being etched in accordance with this invention.

FIG. 3 is a cross-sectional depiction of a portin of one of the wafers to be etched in the chamber 10 of FIG. 1 or in the chamber 100 of FIG. 2. In FIG. 3, a conventionally patterned masking layer 46 is shown formed on a substrate 48 made of monocrystalline silicon which, for example, is either p- or n-doped to exhibit a resistivity of approximately 1-to-10 ohm-centimeters. In accordance with a feature of the principles of the present invention, the unmasked portions of the silicon substrate 48 are isotropically etched to form recesses therein, as indicated by dashed line 49.

The ability to isotropically etch features in monocrystalline silicon is of practical importance in connection with the fabrication of microminiature electronic devices. Thus, illustratively, the aforespecified recess etched in the substrate 48 of FIG. 2 represents, for example, one step in the process of fabricating an LSI device in which dielectric material subsequently formed in the depicted recess serves to electrically isolate adjacent elements in an LSI chip that includes the substrate 48. Such a device, including isotropically etched recesses in a silicon substrate, is described in a copending commonly assigned application of D. Kahng and T. A. Shankoff, Ser. No. 128,841, filed Mar. 10, 1980, now U.S. Pat. No. 4,271,583.

Other device structures that require isotropic etching of a substrate or layer of monocrystalline silicon during the fabrication thereof are known in the art. Moreover, the isotropic etching processes specified herein are also applicable to the thinning of silicon wafers. In accordance with the principles of the present invention, such thinning can be done relatively quickly and uniformly.

Isotropic etching of polysilicon layers is of significant importance in the fabrication of LSI devices. Thus, for example, in making MOS RAMs it is typically necessary in the fabrication sequence to precisely pattern thin layers of polysilicon. Illustratively, one such known device fabrication sequence involves initially anisotropically etching an undoped polysilicon layer commonly referred to as the poly 2 level. Advantageously, anisotropic etching of polysilicon is carried out by using the techniques described in a copending commonly assigned application of D. Maydan and D. N. Wang (Case 17-3), designated application Ser. No. 119,103, filed Feb. 6, 1980. Typically, the poly 2 level, after being anisotropically etched, includes portions that underlie a previously patterned doped polysilicon layer (the so-called poly 1 level), as will be apparent from the detailed discussion hereinbelow in connection with the description of FIG. 7. If these underlying poly 2 portions are not removed from the layered structure being fabricated, faulty devices will likely result. Hence, removal of the underlying poly 2 portions is necessary. And, in accordance with the principles of the present invention, removal of these portions is advantageously carried out in a dry isotropic etching step of the type devised by applicants and specified herein.

Figure 4:
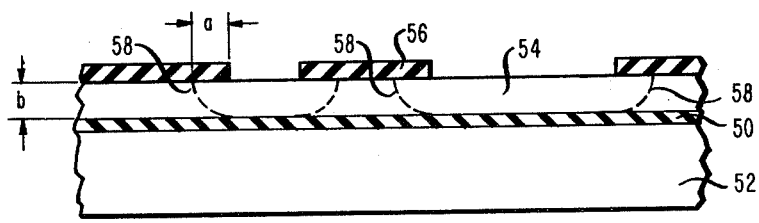
FIG. 4 is a cross-sectional representation of a masked polycrystalline silicon layer to be etched in accordance with the present invention.

FIG. 4 schematically represents in cross-section a portion of an idealized device structure that includes a polysilicon layer to be etched. In FIG. 4, a thin (for example, a 500-Angstrom-unit thick) layer 50 of silicon dioxide is shown on a monocrystalline silicon member 52. On top of the layer 50 is a layer 54 of polycrystalline silicon approximately 5000 Angstrom units thick. On top of the layer 54 to be etched is a conventionally patterned masking layer 56.

In accordance with a feature of the principles of the present invention, isotropic etching of layers of either doped or undoped polysilicon is achieved. Thus, FIG. 4 is to be considered a generic depiction in which the layer 54 is made of undoped or doped polysilicon. Isotropic etching of the layer 54 of FIG. 4 is represented therein by curved dashed lines 58. A completely isotropic profile is represented by the lines 58. In such a profile, the maximum extent of lateral etching (undercutting), designated a in FIG. 4, equals the thickness b of the etched layer 54.

Herein, the term "doped" polysilicon is intended to refer to a polysilicon layer to which a dopant such as phosphorous has been added. Illustratively, the dopant concentration in such a layer is controlled to establish a resistivity in the range 20-to-100 ohm-centimeters.

Moreover, it is to be understood that the term "silicon" herein is employed in a generic sense to encompass monocrystalline silicon, undoped polycrystalline silicon and doped polycrystalline silicon.

In accordance with the principles of this invention, various materials are suitable for forming the patterned masking layers 46 and 56 shown in FIGS. 3 and 4. These materials include organic or inorganic resists, silicon dioxide, magnesium oxide, aluminum oxide, titanium, tantalum, tungsten oxide, cobalt oxide, and the refractory silicides of titanium, tantalum and tungsten. Masking layers made of these materials are patterned by utilizing standard lithographic and etching techniques.

In accordance with one specific feature of this invention, completely isotropic plasma-assisted etching of monocrystalline silicon and doped or undoped polycrystalline silicon is carried out in a pure chlorine trifluoride ($ClF_3$) gas atmosphere. As specified earlier above, etching can be carried out in, for example, a parallel-plate reactor of the type shown in FIG. 1 or in a multi-faceted reactor of the type shown in FIG. 2. For etching in such equipment, in accordance with a specific illustrative example, a pressure of about 50 microns is established in the etching chamber. For a parallel-plate reactor, a chlorine trifluoride gas flow into the etching chamber of, for example, approximately 10 cubic centimeters per minute is advantageous. For a multifaceted reactor, a chlorine trifluoride gas flow of, for example, approximately 30 cubic centimeters per minute is established. (As is well known, the particular gas flow rates that are selected depend to a large extent on the specific reactor design and the etch rates desired therein.) Moreover, in accordance with the invention, a power density of, for example, approximately 0.06 watts per square centimeter is established at the surfaces of the workpieces to be etched in a multifaceted reactor. For a parallel-plate reactor, the corresponding power density is, for example, 0.025 watts per square centimeter.

For the particular conditions established in the aforespecified illustrative examples, monocrystalline silicon, undoped polycrystalline silicon and doped polycrystalline silicon were each isotropically etched in the specified equipments at a rate of approximately 1750, 1200 and 1200 Angstrom units per minute, respectively.

Isotropic etching processes of the type specified above are characterized by a relatively high differential etch rate with respect to, for example, both silicon dioxide and standard resist materials such as HPR-204 (commercially available from Philip A. Hunt Chemical Corp., Palisades Park, N.J.). The aforespecified particular illustrative processes etch silicon approximately 50 times faster than silicon dioxide and about five times faster than resist. Moreover, the specified processes also etch silicon approximately 50 times faster than materials such as phosphorus-doped glass and silicon nitride. The practical significance of such relatively high differential etch rates for LSI device fabrication is apparent.

The above-specified particular examples of isotropic plasma-assisted etching utilizing chlorine trifluoride are illustrative only. More generally, in accordance with the principles of the present invention, such etching can be carried out by selecting pressures, gas flows and power densities in the ranges 2-to-500 microns, 2-to-300 cubic centimeters per minute, and 0.01-to-1 watt per square centimeter, respectively.

In the aforespecified plasma-assisted etching processes, chlorine trifluoride is dissociated in the reaction chamber under the influence of the applied electric field to produce fluorine atoms that rapidly etch silicon isotropically but that etch other materials such as silicon dioxide relatively slowly. Moreover, the other reaction products formed in the chamber during etching also attack the other workpiece materials such as silicon dioxide slowly relative to the rate at which silicon is etched.

Applicants have determined that other fluorine-containing gaseous compounds are suitable, under specified conditions, for isotropically patterning silicon in a dry etching process with high selectivity relative to other materials such as silicon dioxide. These other compounds also dissociate in the reaction chamber to form fluorine species that etch silicon and to form reaction products that do not etch other materials such as silicon dioxide to any substantial extent relative to the etching of silicon.

In accordance with a feature of applicants' invention, other fluorine-containing gaseous compounds such as nitrogen trifluoride ($NF_3$), bromine trifluoride ($BrF_3$) and iodine trifluoride ($IF_3$) can also be utilized to etch silicon isotropically with high selectivity relative to, for example, silicon dioxide. Advantageously, such etching is carried out in equipment of the type shown in FIG. 1 or FIG. 2 in a plama-assisted etching process.

In such equipment, plasma-assisted etching with $NF_3$, $BrF_3$ and $IF_3$ can be carried out by selecting pressures, gas flows and power densities in the ranges specified above for $ClF_3$.

In accordance with the principles of applicants' invention, each of the aforespecified fluorine-containing gaseous compounds is effective by itself, without any other constituent mixed therewith, to etch silicon isotropically. But, additionally, in accordance with applicants' invention, it is also feasible to selectively change some of the etching parameters by using mixtures of gases. Thus, for example, chlorine trifluoride may be mixed with an inert gas such as argon or with carbon tetrafluoride or with chlorine to selectively reduce the etching rate of silicon. Moreover, the addition of fluorine or carbon tetrafluoride or chlorine to chlorine trifluoride enables selective control of the amount of undercutting achieved during the silicon-etching process. A particular example of such control, utilizing chlorine as the additive gas, is illustrated by FIG. 5.

Figure 5:
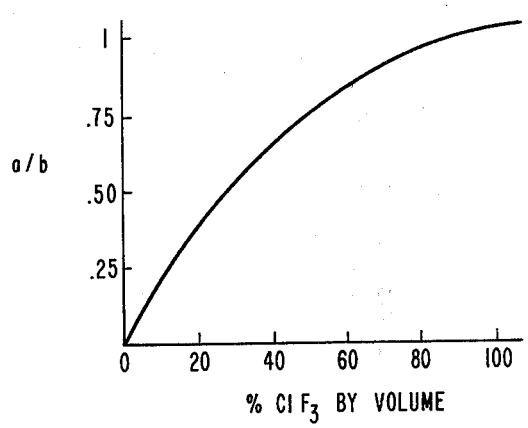
FIG. 5, taken together with FIG. 6, illustrate the manner in which undercutting of an etched layer varies in accordance with the volume percent of a fluorine-containing gas included in the etching mixture.

In the graph of FIG. 5, the extent of undercutting achieved during etching is shown as varying with the volume percent of chlorine trifluoride included in a mixture of chlorine trifluoride and chlorine. The quantity a/b in FIG. 5 is in effect defined in FIG. 6 which shows in cross-section a representative layered device to be etched.

Figure 6:
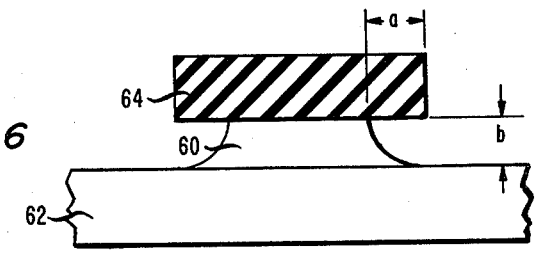

In FIG. 6, a polysilicon layer 60 to be etched is shown overlying a layer 62 made, for example, of silicon dioxide. The thickness of the layer 60 is designated b. On top of the polysilicon layer 60 is a patterned masking layer 64 made, for example, of a resist material. The maximum lateral etch dimension in the layer 60 is designated a. In the maximum undercutting case, the etching process is completely isotropic and a equals b.

As indicated in FIG. 5, completely isotropic etching (a/b=1) occurs when the gaseous environment in the reactive sputter etching chamber is made up entirely of chlorine trifluoride. As the volume percent of chlorine trifluorine is decreased, by adding chlorine thereto, the extent of lateral undercutting decreases. When the chlorine trifluoride content of the mixture is reduced to zero, leaving a pure chlorine environment in the chamber, no lateral undercutting occurs and the etching process is completely anisotropic (a/b=0). Such aniostropic plasma-assisted etching of polysilicon in a chlorine atmosphere is described in the aforecited Maydan-Wang application.

One particularly advantageous application of applicants' herein-described dry etching process is in the fabrication of LSI MOS RAMs. A cross-sectional schematic representation of a portion of such a device is shown in FIG. 7.

Figure 7:
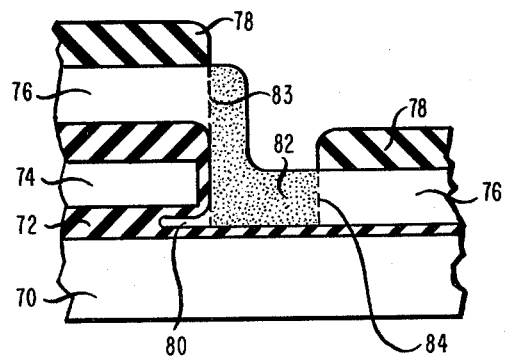
FIG. 7 is a cross-sectional representation of a specific illustrative LSI device fabricated in accordance with the principles of the present invention.

FIG. 7 includes a silicon substrate 70 and a silicon dioxide region 72. Portions of the region 72 envelop a doped polysilicon layer 74 designated the poly 1 layer. An undoped polysilicon layer 76 (poly 2) is disposed on top of the oxide region 72. A patterned masking layer 78 made also, for example, of silicon dioxide is formed by standard techniques on top of the poly 2 layer 76.

In the course of fabricating a device of the type represented in FIG. 7, the oxide layer 72 is initially patterned in a standard etching step wherein the oxide layer 72 is typically undercut relative to the right-hand vertical edge of the poly 1 layer 74. In one particular illustrative device embodiment, the extent of the undercut approximated 2000 Angstrom units. Accordingly, during subsequent formation of the poly 2 layer 76, a so-called filament of polysilicon material is formed beneath the poly 1 layer 74. In FIG. 7, the polysilicon filament is designated by reference numeral 80. Unless the filament 80 is removed during subsequent processing, device failures arising therefrom can result, as is well known in the art.

The pattern to be formed in the poly 2 layer 76 of FIG. 7 is defined by masking layer 78. Advantageously anisotropic etching of the layer 76 is then carried out by utilizing the plasma-assisted etching process described in the aforecited Maydan-Wang application. As a result of such etching, the stipled portion 82 of the layer 76 between dashed lines 83 and 84 is removed. Such aniostropic etching does not, however, remove the polysilicon filament 80.

In accordance with the principles of the present invention, the filament 80 is removed in an isotropic plasma-assisted etching step of the type described herein utilizing a fluorine-containing gaseous compound. Such an etching step is effective to remove the polysilicon filament 80. (Of course, the opening previously formed in the poly 2 layer 76 and defined by the vertical dashed lines 83, 84 is also slightly enlarged laterally.) Moreover, because of the excellent selectivity of applicants' etching process relative to silicon dioxide, the portion of the oxide layer 72 underlying the stipled region 82, is relatively unaffected during etching of the polysilicon filament 80. For example, if the lateral extent of the filament 80 to be etched is 2000 Angstrom units, the specified portion of the layer 72 will be thinned by only about 40 Angstrom units.

Applicants' etching processes described herein are characterized by a relatively high etch rate and by a relatively high uniformity of etch rate across each workpiece as well as from workpiece to workpiece. In practice, such variations in etch rate have been determined not to exceed about 5 percent.

Additionally, the processes of the present invention are characterized by the absence of any proximity effects. (As is well known, the proximity effect is the variation in the lateral extent of undercutting during isotropic etching as a function of the spacing between masking elements.) More generally, the edge profile, the etch rate and the selectivity of each of these processes have been determined to be virtually independent of the specific pattern geometry, feature size and masking material involved in the etching operation. Also, significantly, the herein-specified processes are carried out at relatively low power levels and with a high differential etch rate relative to materials such as silicon dioxide.

Finally, it is to be understood that the above-described procedures are only illustrative of the principles of the present invention. In accordance with these principles, numerous modifications and alternatives may be devised by those skilled in the art without departing from the spirit and scope of the invention.

We claim:

1. A method for fabricating a microminiature device in accordance with a process sequence that includes at least one step in which a silicon surface of the device is to be etched with high selectivity relative to other surfaces of the device in a dry etching apparatus that comprises a plasma established between anode and cathode electrodes one of which electrodes holds the device to be etched, the plasma resulting from imposition of an electric field across a gaseous environment introduced between said electrodes, CHARACTERIZED IN THAT the gaseous environment comprises a fluorine-containing gaseous compound that provides in said apparatus under the influence of said electric field silicon-etching fluorine species and reaction products that do not etch said other surfaces of said device to any substantial extent relative to the etching of said silicon surface, wherein said gaseous compound is selected from the group consisting of chlorine trifluoride, nitrogen trifluoride, bromine trifluoride and iodine trifluoride.

2. A method as in claim 1, wherein the silicon surfce of said device has a patterned masking layer thereon, said device is mounted on the cathode electrode of said apparatus, and the etching of said silicon surface is controlled to be completely isotropic.

3. A method as in claim 1 wherein the gaseous environment comprises said fluorine-containing gaseous compound and an additional constituent selected from the group consisting of an inert gas, chlorine, and fluorine.

4. A method as in claim 3 wherein the gaseous environment comprises said fluorine-containing gaseous compound and chlorine, and the etching of said silicon surface is controlled to be isotropic with the maximum extent of lateral undercutting decreasing as the volume percent of said chlorine constituent is increased.

5. A method as in claim 1 wherein a pressure of approximately 2-to-500 microns is established in said apparatus and a power density of 0.01-to-1 watt per square centimeter is established at the surface of the device to be etched.

6. A method as in claim 1 wherein the device to be etched is mounted on the driven cathode electrode of a multifaceted plasma-assisted etching apparatus, said gaseous environment comprises chlorine trifluoride, a pressure of 50 microns is established in said apparatus and a power density of 0.04 watts per square centimeter is established at the surface of the device to be etched.

* * * * *

UNITED STATES PATENT AND TRADEMARK OFFICE
CERTIFICATE OF CORRECTION

PATENT NO. : 4,310,380

DATED : January 12, 1982

INVENTOR(S) : Daniel L. Flamm, Dan Maydan, and David N. Wang

It is certified that error appears in the above—identified patent and that said Letters Patent is hereby corrected as shown below:

Column 1, line 49, after "illustrative" delete "/".
Column 2, line 31, "to" should read --of--. Column 3, line 17, "105,610" should read --105,620--. Column 3, line 17, "now abandoned" should read --now U. S. Patent No. 4,298,443--.
Column 3, line 23, "in" should read --In--. Column 4, line 18, "surface" should read --surfaces--. Column 4, line 52, "portin" should read --portion--. Column 7, line 63, "trifluorine" should read --trifluoride--. Column 10, line 3, "surfce" should read --surface--. Column 10, line 15, "compound" should read --compounds--.

Signed and Sealed this

Eleventh Day of May 1982

[SEAL]

Attest:

Attesting Officer

GERALD J. MOSSINGHOFF

Commissioner of Patents and Trademarks